(12) United States Patent
Hargreaves et al.

(10) Patent No.: US 7,928,729 B2
(45) Date of Patent: Apr. 19, 2011

(54) DISTORTION-FREE MAGNETIC RESONANCE IMAGING NEAR METALLIC IMPLANTS

(75) Inventors: Brian A. Hargreaves, Menlo Park, CA (US); Wenmiao Lu, Palo Alto, CA (US); John M. Pauly, Stanford, CA (US); Garry E. Gold, Stanford, CA (US); Kim B. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 280 days.

(21) Appl. No.: 12/188,031

(22) Filed: Aug. 7, 2008

(65) Prior Publication Data

US 2010/0033179 A1 Feb. 11, 2010

(51) Int. Cl.
*G01V 3/00* (2006.01)

(52) U.S. Cl. ...................... 324/309; 324/307

(58) Field of Classification Search .................. 324/309, 324/307
See application file for complete search history.

(56) References Cited

U.S. PATENT DOCUMENTS

| | | | | |
|---|---|---|---|---|
| 4,843,322 | A | 6/1989 | Glover | |
| 5,258,711 | A * | 11/1993 | Hardy | 324/309 |
| 6,678,544 | B2 * | 1/2004 | Butts et al. | 600/410 |
| 7,071,690 | B2 * | 7/2006 | Butts et al. | 324/309 |
| 7,227,357 | B2 * | 6/2007 | Werthner | 324/307 |

OTHER PUBLICATIONS

Malfair et al., "Imaging the Degenerative Diseases of the Lumbar Spine," Magn Reson Imaging Clin N Am, vol. 15, 2007, pp. 221-238.

Cho et al., "Total inhomogeneity correction including chemical shifts and susceptibility by view angle tilting," Medical Physics, vol. 15(1), Jan./Feb. 1988, pp. 7-11.
McGowen et al., "Reduction of Image Distortion in the Presence of Metal," International Society for Magnetic Resonance in Medicine, Vancouver, 1997, 1 page.
Vandevenne et al., "MR Imaging of Orthopedic Prostheses: Metal Artifact Reduction Using View Angle Tilting", Radiological Society of North America, 84th Scientific Assembly and Annual Meeting, Chicago, 1998, p. 465.
Olsen et al., "Metal Artifact Reduction Sequence: Early Clinical Applications," RadioGraphics 2000, vol. 20, pp. 699-712.
Lee et al., "Quantitative assessment of an MR technique for reducing metal artifact: application to spin-echo imaging in a phantom," Skeletal Radiol, vol. 30, 2001, pp. 398-401.
Kolind et al., "Quantitative Evaluation of Metal Artifact Reduction Techniques," Journal of Magnetic Resonance Imaging, vol. 20, 2004, pp. 487-495.
Butts et al., "Management of Biopsy Needle Artifacts: Techniques for RF-Refocused MRI," Journal of Magnetic Resonance Imaging, vol. 9, 1999, pp. 586-595.

(Continued)

*Primary Examiner* — Louis M Arana
(74) *Attorney, Agent, or Firm* — Beyer Law Group LLP

(57) ABSTRACT

A method for 3D magnetic resonance imaging (MRI) with slice-direction distortion correction is provided. One or more selective cross-sections with a thickness along a first axis is excited using a RF pulse with a bandwidth, wherein a selective cross-section is either a selective slice or selective slab. A refocusing pulse is applied to form a spin echo. One or more 2D encoded image signals are acquired with readout along a second axis and phase encoding along a third axis. Slice-direction distortion is corrected by resolving the position by resolving the frequency offset.

20 Claims, 11 Drawing Sheets

OTHER PUBLICATIONS

Duerk et al., "Pulse Sequences for Interventional Magnetic Resonance Imaging," Topics in Magnetic Resonance Imaging, vol. 11(3), 2000, pp. 147-162.

Daniel et al., "The use of view angle tilting to reduce distortions in magnetic resonance imaging of cryosurgery," Magnetic Resonance Imaging, vol. 18, 2000, pp. 281-286.

Yang et al., "Removal of local field gradient artifacts in T2*-weighted images at high fields by gradient-echo slice excitation profile imaging," Magn Reson Med, vol. 39, 1998, pp. 402-409.

Ro et al., "Susceptibility Magnetic Resonance Imaging Using Spectral Decomposition," Magn Reson Med, vol. 33, 1995, pp. 521-528.

Posse et al., "Three-dimensional Echo-planar MR Spectroscopic Imaging at Short Echo Times in the Human Brain," Radiology, vol. 192, 1994, pp. 733-738.

Gravina et al., "Sensitivity and Resolution of Constant-Time Imaging," Journal of Magnetic Resonance, Series B 104, 1994, pp. 53-61.

David C. Alsop, "The Sensitivity of Low Flip Angle RARE Imaging", Magn Reson Med, vol. 37, 1997, pp. 176-184.

Sodickson et al., "Simultaneous Acquisition of Spatial Harmonics (SMASH): Fast Imaging with Radiofrequency Coil Arrays," Magn Reson Med, vol. 38, 1997, pp. 591-603.

Pruessmann et al., "SENSE: Sensitivity encoding for Fast MRI", Magn Reson Med, vol. 42, 1999, pp. 952-962.

Noll et al., "Homodyne Detection in Magnetic Resonance Imaging," IEEE Trans Med Imaging, vol. 10 No. 2, 1991, pp. 154-163.

Lu et al., "Towards Artifact-free MRI near Metallic Implants," 16$^{th}$ ISMRM meeting, 2008, p. 838.

* cited by examiner

US 7,928,729 B2

DISTORTION-FREE MAGNETIC RESONANCE IMAGING NEAR METALLIC IMPLANTS

GOVERNMENT RIGHTS

This invention was made with Government support under contracts 1R01EB002524-01, 1R01HL075803-01, 2P41RR009784-11, and 5R01CA077677-09 awarded by the National Institutes of Health. The Government has certain rights in this invention.

BACKGROUND OF THE INVENTION

This invention relates generally to magnetic resonance imaging (MRI). Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

U.S. Pat. No. 4,843,322 to Glover, issued Jun. 27, 1989, which is incorporated by reference for all purposes, discloses a method for producing multi-slice MRI images.

SUMMARY OF THE INVENTION

In accordance with the invention, a method for 3D magnetic resonance imaging (MRI) with slice-direction distortion correction is provided. One or more selective cross-sections with a thickness along a first axis is excited using a RF pulse with a bandwidth, wherein a selective cross-section is either a selective slice or selective slab. A refocusing pulse is applied to form a spin echo. One or more 2D encoded image signals are acquired with readout along a second axis and phase encoding along a third axis. Slice-direction distortion is corrected by resolving the position by resolving the frequency offset.

In another manifestation of the invention an apparatus for providing 3D magnetic resonance imaging with slice-direction distortion compensation is provided. A magnetic resonance imaging excitation and detection system is provided. A controller electrically is controllably connected to the magnetic resonance imaging excitation and detection system and comprises a display, at least one processor, and computer readable media. The computer readable media comprises computer readable code for exciting one or more selective cross-sections with a thickness along a first axis using a RF pulse with a bandwidth, wherein a selective cross-section is either a selective slice or selective slab, computer readable code for applying a refocusing pulse to form a spin echo, computer readable code for acquiring one or more 2D encoded image signals with readout along a second axis and phase encoding along a third axis, computer readable code for correcting slice-direction distortion by resolving the position by resolving the frequency offset, and computer readable code for displaying a 3D magnetic resonance image with slice-direction distortion correction on the display.

The invention and objects and features thereof will be more readily apparent from the following detailed description and appended claims when taken with the drawings.

DETAILED DESCRIPTION OF ILLUSTRATED EMBODIMENTS

Definitions: Selectively excited cross-sections in the specification and claims may either be a selectively excited slice or slab.

An embodiment of the invention accomplishes the purpose of using magnetic resonance imaging to form distortion-free images of tissue near metallic implants, which cannot be obtained with current MRI techniques.

Magnetic resonance imaging (MRI) is widely regarded as the best imaging modality for evaluating orthopedic conditions such as osteomyelitis, avascular necrosis, tendon or ligamentous injury, bone or soft tissue lesions, spinal nerve root compression, and spinal stenosis. MR imaging is "ideally suited for delineating the presence, extent, and complications of degenerative spinal disease" as described in Malfair D, Beall D., "Imaging the degenerative disease of the lumbar spine," Magn Res Im Clinics North Am 2007; 15:221-238, which is incorporated by reference for all purposes. Unfortunately, in patients with previously implanted metallic hardware, MRI is extremely limited by severe image artifacts.

Figure 1A:
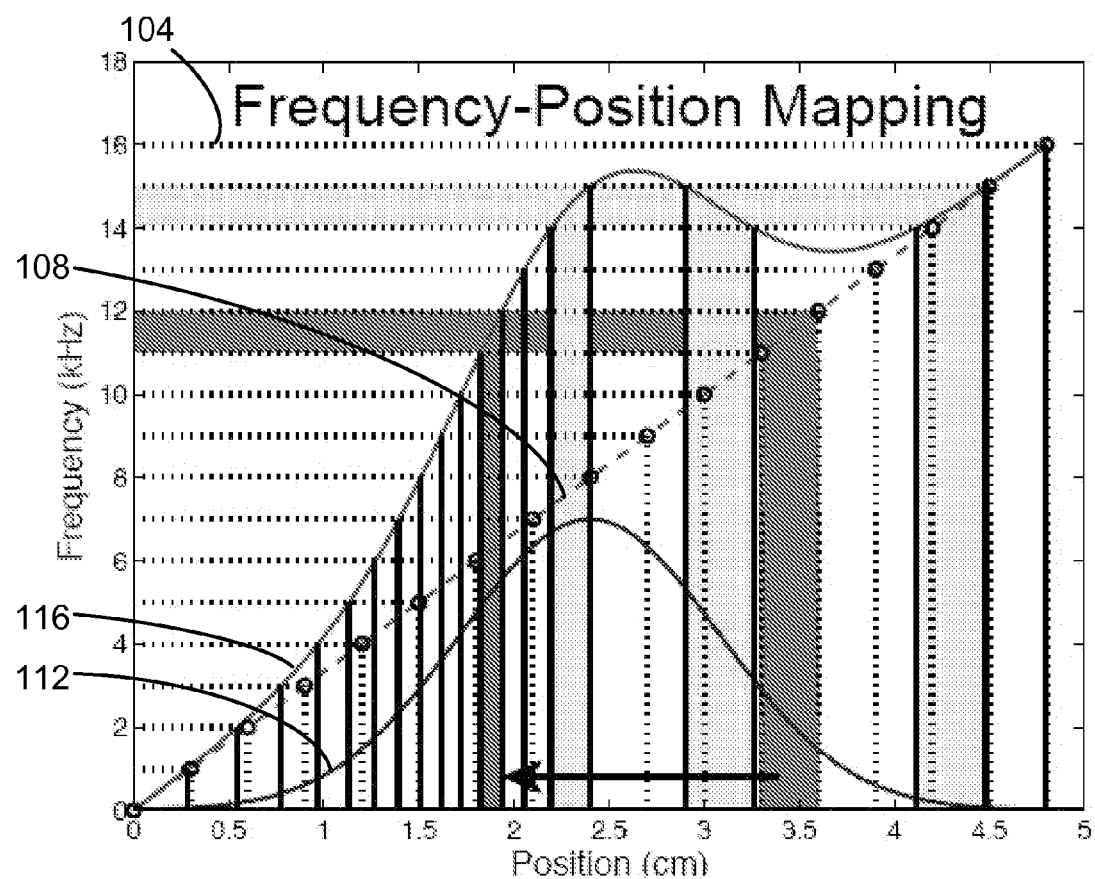
FIGS. 1A-B show the frequency shift of the spins near a metallic implant that results in image distortion.
Figure 1B:
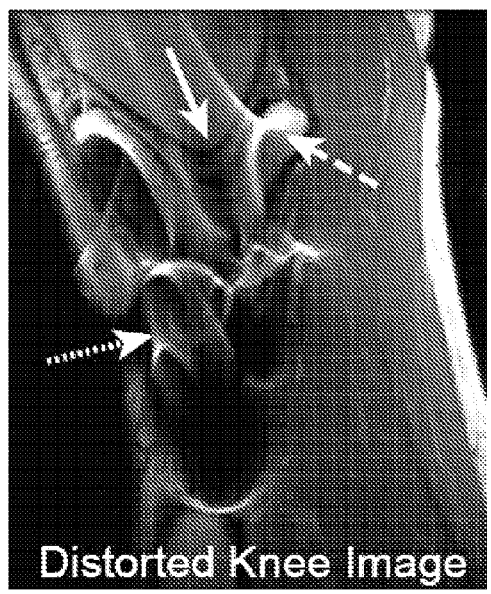

The frequency shift of the spins near a metallic implant results in image distortion in two well known manifestations, demonstrated in FIGS. 1A-B. FIG. 1A shows desired slice positions 104 that are mapped linearly to frequency bands by a gradient 108. A frequency variation 112 superimposes on the gradient and changes the frequency-position mapping to that shown by line 116. The result is a position shift including slice misplacement and scaling of slice widths as shown by the darkly shaded regions and arrow. In extreme cases, one RF band can excite multiple regions (lightly shaded regions). Position-encoding during readout can be affected by identical distortion effects. FIG. 1B shows a sagittal spin echo image in a subject with steel screws below the knee that shows the dramatic effects of in-plane distortion (solid arrow), slice displacement (dotted arrow) and slice piling-up artifact (dashed arrow).

Because a gradient is used to map frequency to position, a frequency shift results in errant mapping, and causes a position shift of the source in the image. Such shifts can occur in both the frequency-encoding direction during readout and the slice-select direction during excitation. The magnitude of these two artifacts depends on the shape, size, and material of the metallic implant, as well as imaging methods and parameters.

An embodiment of the invention provides a combination of excitation, imaging and reconstruction techniques that enables distortion-free MR imaging near metallic implants in a clinically-feasible scan time.

An embodiment of the invention builds upon view angle tilting (VAT), originally described in Cho Z, Kim D, Kim Y., "Total inhomogeneity correction including chemical shifts and susceptibility by view angle tilting," Medical Physics 1988; 15:7-11, which is incorporated by reference for all purposes. VAT has been used for reducing metal artifacts around prostheses as described in McGowen A, MacKay A, Xiang Q S., "Reduction of image distortion in the presence of metal," International Society for Magnetic Resonance in Medicine," Vancouver, 1997, Vandevenne J, Heiss S, Butts K, Bergman G, Goodman S, Lang P., "MR imaging of orthopedic prostheses: Metal artifact reduction using view angle tilting," RSNA, Chicago, 1998. p. 465; Olsen R V, Munk P L, Lee M J, Janzen D L, MacKay A L, Xiang Q S, Masri B., "Metal artifact reduction sequence: early clinical applications," Radiographics 2000; 20:699-712, Lee M J, Janzen D L, Munk P L, MacKay A, Xiang Q S, McGowen A., "Quantitative assessment of an MR technique for reducing metal artifact: application to spin-echo imaging in a phantom," Skeletal Radiol 2001; 30:398-401, and Kolind S H, MacKay A L, Munk P L, Xiang Q S., "Quantitative evaluation of metal artifact reduction techniques," J Magn Reson Imaging 2004; 20:487-495, which are all incorporated by reference for all purposes, and interventional devices such as needles, as described in Butts K, Pauly J M, Daniel B L, Kee S, Norbash A M., "Management of biopsy needle artifacts: techniques for RF-refocused MRI," J Magn Reson Imaging 1999; 9:586-95 and Duerk J L, Butts K, Hwang K P, Lewin J S. "Pulse sequences for interventional magnetic resonance imaging," Top Magn Reson Imaging 2000; 11:147-62, which are all incorporated by reference for all purposes, and cryoprobes, as described in Daniel B L, Butts K., "The use of view angle tilting to reduce distortions in magnetic resonance imaging of cryosurgery," Magn Reson Imaging 2000; 18:281-6, which is incorporated by reference for all purposes.

Figure 2:
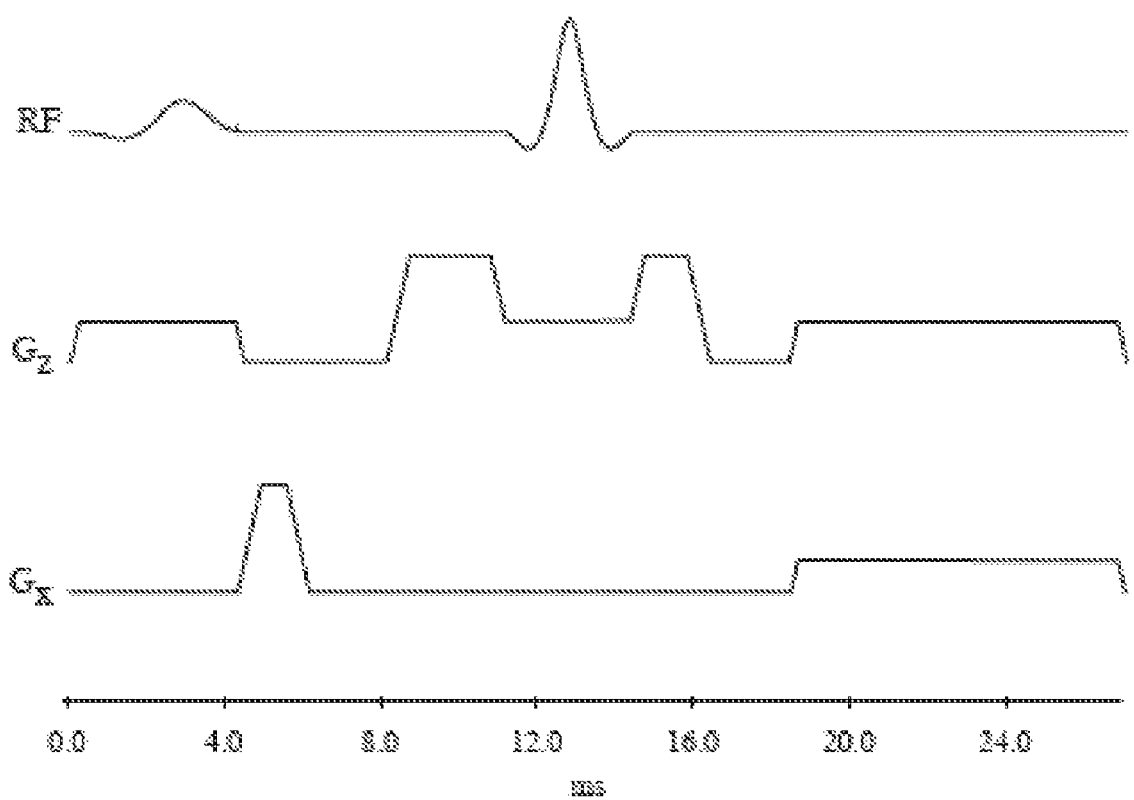
FIG. 2 shows the view angle tilting pulse sequence that uses a gradient on the slice-select (z) axis during readout that is equal in amplitude to the slice-select gradient, to eliminate in-phase distortion.

An elegantly simple example uses a gradient applied on the slice select axis during readout, with an amplitude equal to that of the slice select gradient, as shown in FIG. 2. FIG. 2 shows the view angle tilting pulse sequence uses a gradient on the slice-select (z) axis during readout that is equal in amplitude to the slice-select gradient, to eliminate in-phase distortion.

Figure 3A:
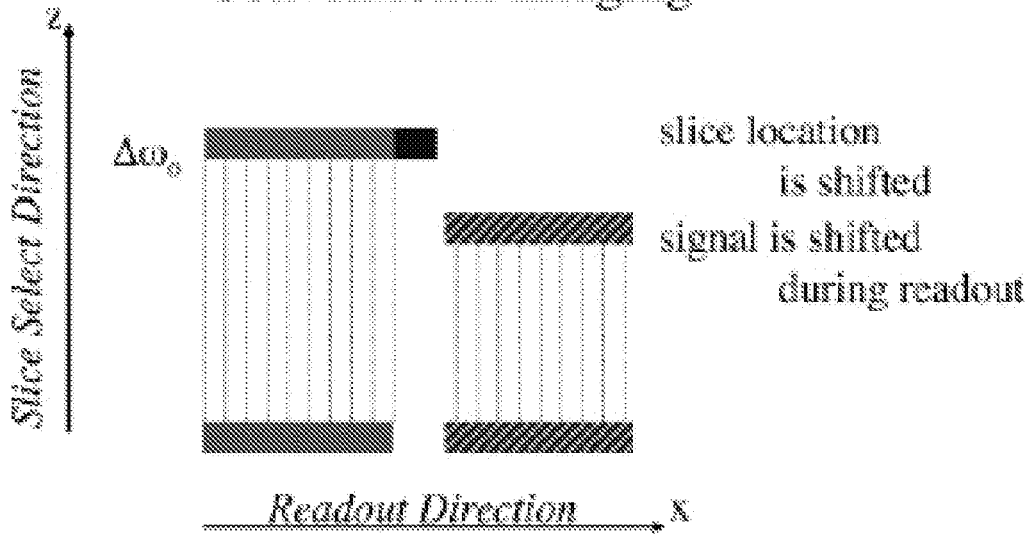
FIGS. 3A-B schematically demonstrate conventional MRI (FIG. 3A) and VAT MRI (FIG. 3B) for two tissues with different resonant frequencies such as adipose and aqueous tissues.
Figure 3B:
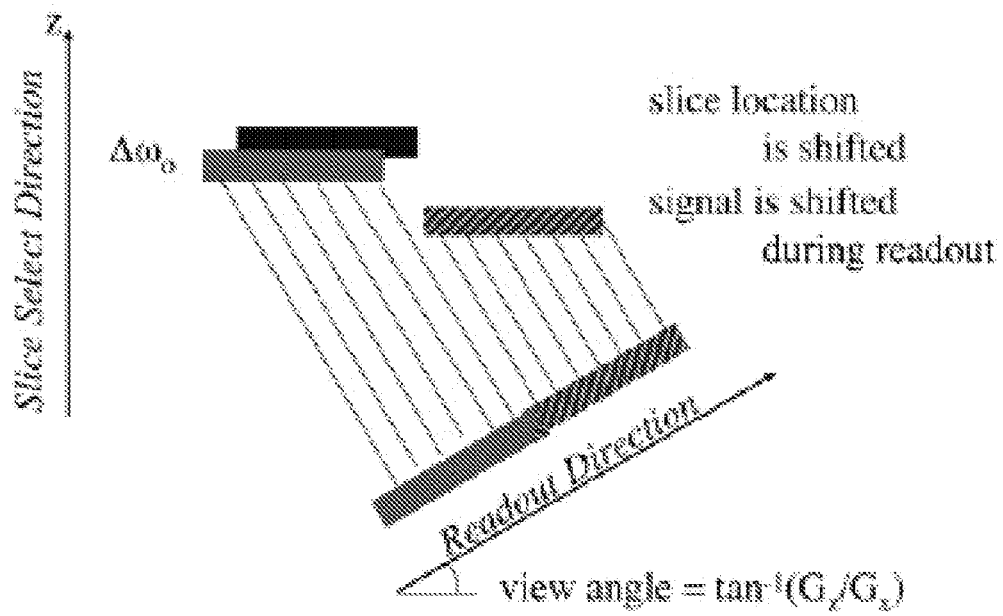

The slice is then effectively viewed at an angle $$\phi = \tan^{-1}\frac{G_z}{G_x},$$

which causes shifts in the slice-selection direction to exactly cancel shifts in the readout direction, as shown in FIGS. 3A-B. VAT is a powerful method because it registers all off-resonance spins in the image plane.

An alternative view of VAT is provided by playing the same slice-select gradient during the readout, the frequency of all spins in the excited slice is kept within the RF excitation bandwidth, which is low enough to avoid in-plane distortion beyond the tilt of the voxels shown in FIGS. 3A-B. FIGS. 3A-B schematically demonstrate conventional MRI (FIG. 3A) and VAT MRI (FIG. 3B) for two tissues with different resonant frequencies such as adipose tissue, on the left, and aqueous tissue, on the right. In conventional MRI, the original slice is shifted, then the signal is shifted during readout. Similarly, these shifts occur in VAT MRI, but the shifts compensate such that the two tissues appear to be registered in the images.

Figures 4A, 4B:
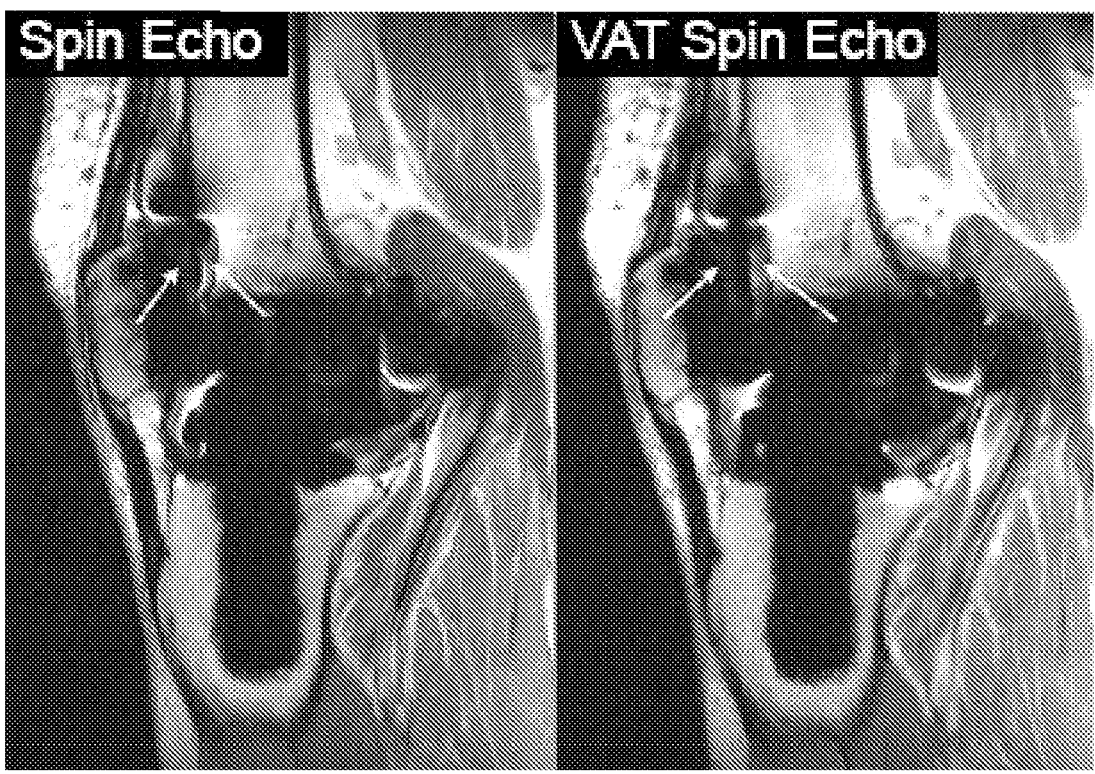
FIGS. 4A-B show images of a patient with a knee implant.

An example image comparison between standard FSE and VAT FSE is provided in FIGS. 4A-B. In these images of a patient with a knee implant, the VAT FSE image, FIG. 4B, eliminates the in-plane distortion that is shown in the FSE image, FIG. 4A. This study confirms that while in-plane distortion is eliminated, severe distortions nevertheless remain in the image, which are primarily from distortions in the slice-select direction. An embodiment of the invention provides techniques to eliminate both in-plane and through-slice distortions.

Technical Description

VAT with Complete Slice-Distortion Correction: An embodiment of the invention provides a method for complete elimination of both slice and in-plane distortions using a view angle tilting (VAT) sequence with additional phase encoding in the slice/slab direction. Techniques, called gradient-echo slice excitation profile imaging (GESEPI) or susceptibility MRI using spectral decomposition, have been proposed to resolve T2* effects with phase encoding in Yang Q X, Williams G D, Demeure R J, Mosher T J, Smith M B., "Removal of local field gradient artifacts in T2*-weighted images at high fields by gradient-echo slice excitation profile imaging," Magn Reson Med 1998; 39:402-409 and Ro Y M, Cho Z H., "Susceptibility magnetic resonance imaging using spectral decomposition," Magn Reson Med 1995; 33:521-528, which are incorporated by reference for all purposes. Resolved spins that otherwise lead to artifacts from field inhomogeneities can then be discarded. An embodiment of the invention, referred to as SEPI-VAT (slab excitation profile imaging with view angle tilting), applies a similar strategy to thin-slab VAT spin echo. However, rather than to only remove the artifacts, this embodiment's goal is to resolve and completely correct the distortions in 3D.

Figure 5:
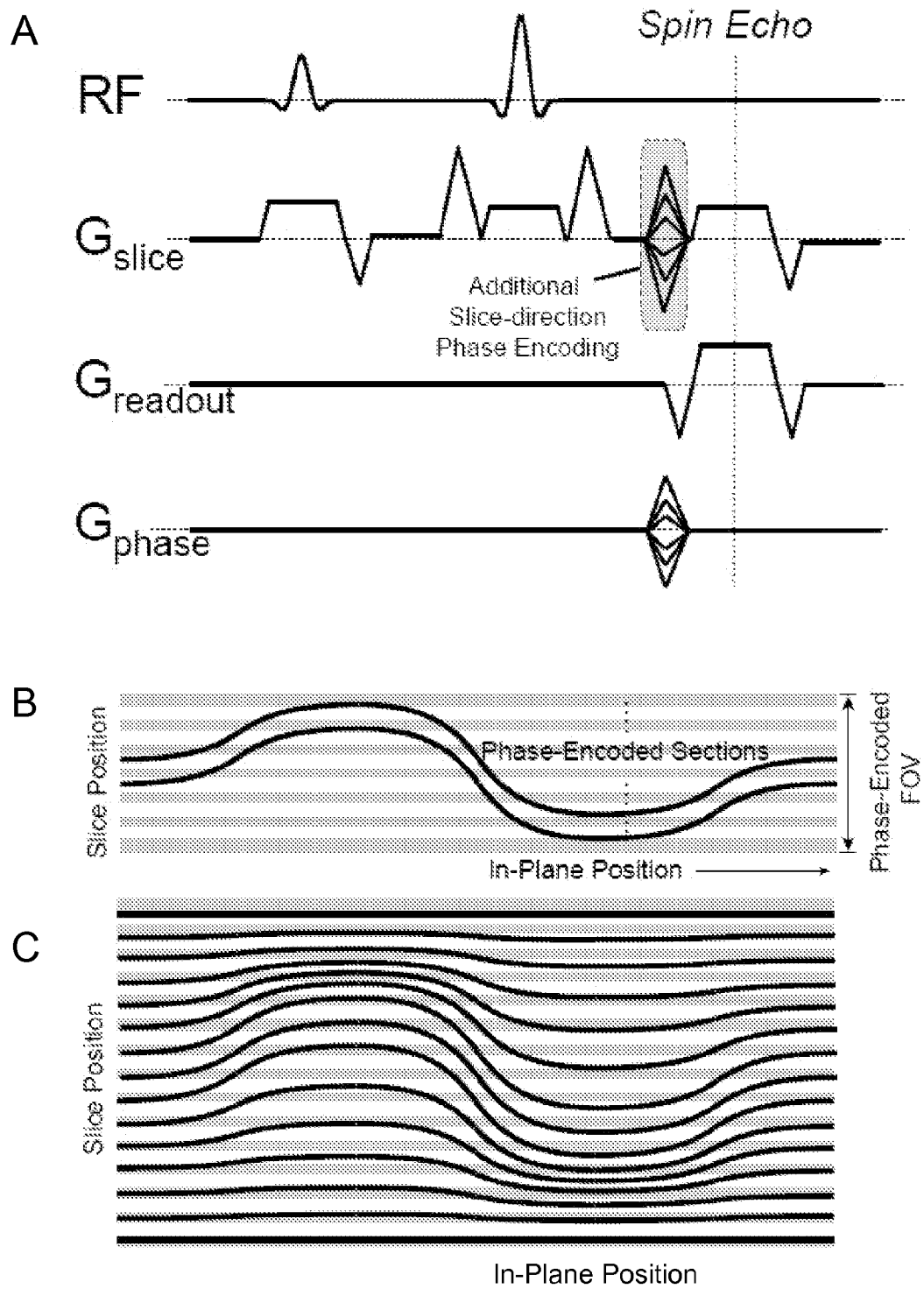
FIGS. 5A-C show a SEPI-VAT sequence and graphs of the in-plane position.

SEPI-VAT: As shown in FIG. 5A, the SEPI-VAT sequence extends the 2D VAT spin echo sequence with additional slice-direction phase encoding. The FOV of the slice-direction phase-encoded must cover the full range of "potato chip" distortions (i.e., through-slice distortions) of the current slice, as shown in FIG. 5B. Since phase-encoding is immune to distortions caused by the frequency shifts, it will allow us to resolve the actual slice-direction locations to the shaded gray sections as shown in FIG. 5B and FIG. 5C. In this sequence, the resolution of the slice-direction phase-encoding, rather than slice thickness, determines the section thickness. Thus we could actually replace the slices with thin slabs (thicker than slices) and reduce the total number of excited slabs needed as will be described shortly, and SEPI-VAT would actually be a 3D technique. The slice or slab widths and position must be carefully chosen such that all spins are excited exactly once, regardless of the frequency shifts. As FIG. 5C shows, it does not matter in which slice the spins are excited: their actual slice-selection locations (gray regions) can be resolved by the additional slice-select phase encoding. When the spins of all slices in the volume are resolved to their actual slice locations, simply summing the spins at the same location eliminates the through-slice distortion.

The SEPI-VAT sequence uses view angle tilting to remove in-plane distortions and additional phase-encoding to resolve the actual slice-select locations of the spins. Although frequency variations result in through-slice distortion as shown by the solid lines in FIG. 5B, the actual locations can be properly resolved by phase-encoding. When all slices in the volume are imaged with phase-encoding, as shown in FIG. 5C, each spin is excited in exactly one slice (or slab), and its position is properly resolved. When the spins of all slices in the volume are resolved to their actual slice locations, summing the spins at the same location eliminates the through-slice distortion. Hence, the SEPI-VAT sequence completely removes all distortions in the image.

Figure 6:
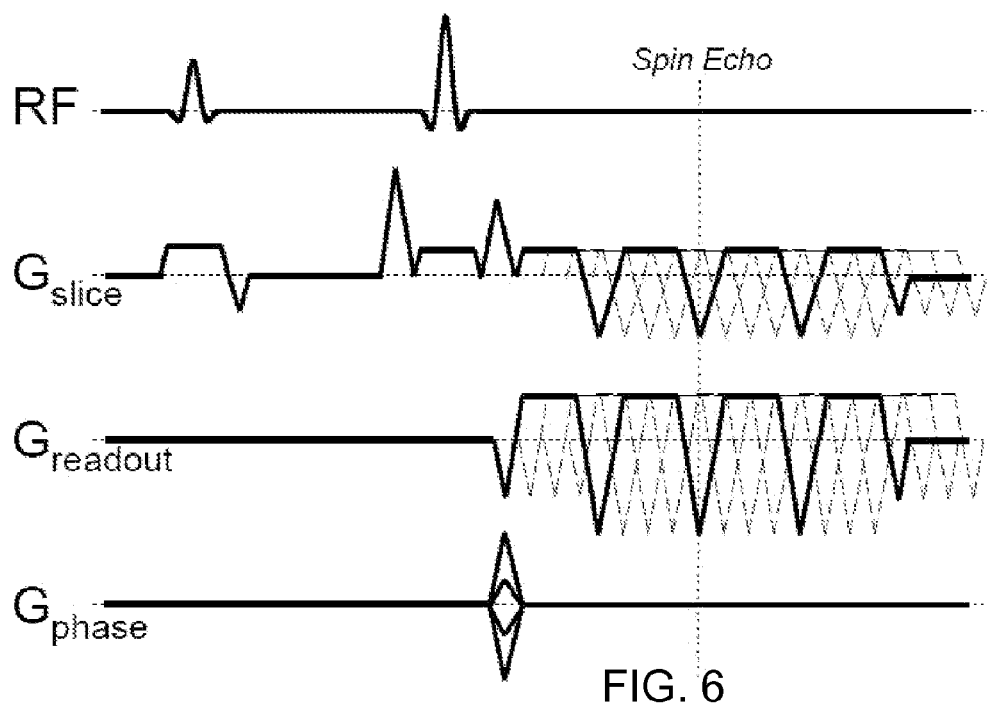
FIG. 6 shows an EPSI-VAT imaging sequence.

EPSI-VAT: A similar, but alternative pulse sequence replaces slice-direction phase encoding with sampling of the $k_f$-axis (time axis) at multiple echo times. An efficient version of this is echo-planar spectroscopic imaging (EPSI), described in Posse S, DeCarli C, Le Bihan D., "Three-dimensional echo-planar MR spectroscopic imaging at short echo times in the human brain," Radiology 1994; 192:733-738, which is incorporated by reference for all purposes, which can be combined with VAT as shown in FIG. 6. FIG. 6 shows an EPSI-VAT imaging sequence, which is a 2D VAT sequence that includes a spectroscopic readout that can have both multiple echoes and multiple interleaves (dashed lines) to acquire the image with a sufficient number of echo times to resolve spectral information with appropriate spectral resolution and range to correct for through-slice distortions. By matching the spectral resolution to the slice RF bandwidth, the through-slice distortion is mapped to frequency in the same way as shown by FIGS. 5B-C. Thus a Fourier transform across echo times followed by summing the signal in different Fourier bins completely corrects the distortion.

Demonstration

Figure 7A:
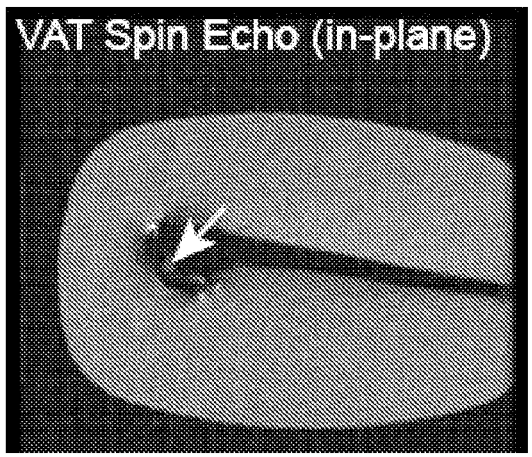
FIGS. 7A-E shows a comparison of a 1.5 T spin echo VAT images (FIG. 7A and FIG. 7C) with that of the SEPI-VAT images (FIG. 7B and FIG. 7D) in a titanium/cobalt shoulder implant, FIG. 7E, immersed in gel.
Figure 7B:
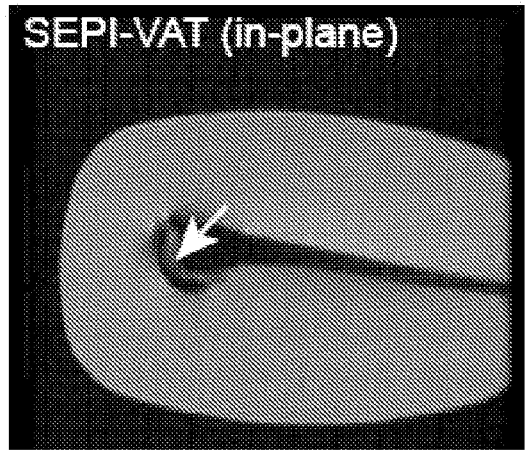
Figure 7C:
Figure 7D:
Figure 7E:
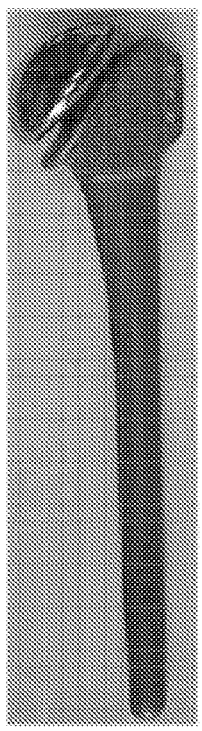

To demonstrate the above SEPI-VAT technique at 1.5 T for T1-weighted multi-slice spin echo using a 1 kHz RF pulse and 16 phase-encoded sections per thin slab, preliminary images using this technique in a phantom with a titanium shoulder implant are compared with those of VAT spin echo in FIGS. 7A-E. For a 128×256 matrix and 16 imaged slices, each 3 mm thick, with TR/TE=500/20 ms, the scan time was about 15 minutes. The results are dramatic—severe distortions in the VAT spin echo results are almost completely removed. Some minor residual piling-up artifact is probably due to minor overlap of slices, as well as some blurring in the through-slice direction. This can be further improved by using a finer phase-encode resolution. These phantom results demonstrate that the technique is clearly feasible for distortion-free MR imaging near metallic implants in a reasonable scan time. FIG. 7A-E shows a comparison of a 1.5 T spin echo VAT images (FIG. 7A and FIG. 7C) with that of the SEPI-VAT images (FIG. 7B and FIG. 7D) in a titanium/cobalt shoulder implant, FIG. 7E, immersed in gel. In the top views, FIGS. 7A-B, the distortion-corrected image, FIG. 7B, shows features within the cobalt-chrome head of the implant that cannot be seen on the uncorrected image, FIG. 7A, shown by the arrows. In the reformatted images, FIG. 7C-D, the curved shape of the implant head is completely distorted in the uncorrected image, FIG. 7C, but clearly visualized in the SEPI-VAT technique, FIG. 7D, despite minor blurring.

Some preliminary 1.5 T SEPI-VAT images from a volunteer with metallic hardware in his spine are shown in FIG. 8A-F. Here a 256×128 matrix over a 24 cm sagittal FOV was used with 22 slices, each 4 mm thick, with a 19 minute scan time. Again, 16 phase encodes were used for each slice, although this is probably insufficient for the shifts caused by stainless steel. Nonetheless, the results shown in FIGS. 8A-F demonstrate almost complete elimination of distortion in both the slice and readout (S/I) directions compared with spin-echo images. Some residual blurring as well as distortion from an inadequate phase-encoded FOV will be addressed further. Comparison of the left-most images shows the true potential of SEPI-VAT to image without distortion near metal.

Figure 8A:
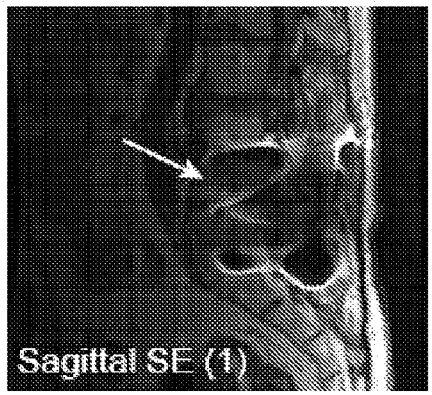
FIGS. 8A-F demonstrate almost complete elimination of distortion in both the slice and readout (S/I) directions compared with spin-echo images.
Figure 8B:
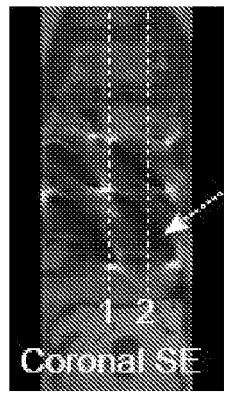
Figure 8C:
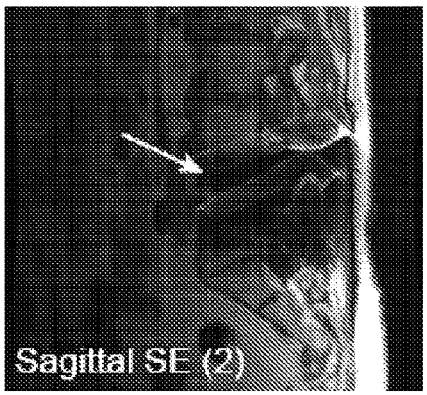
Figure 8D:
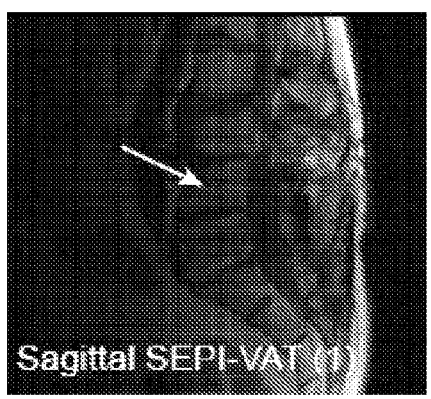
Figure 8E:
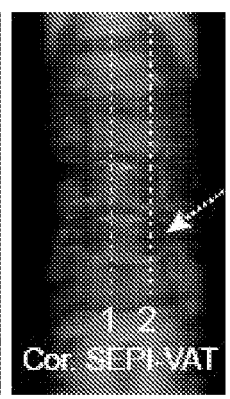
Figure 8F:
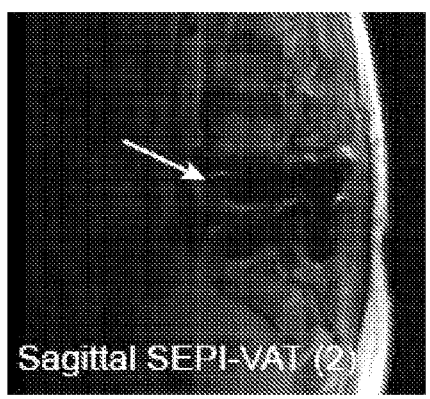

FIGS. 8A-C are spin echo images and FIGS. 8D-F are SEPI-VAT images in the spine of a volunteer with a steel implant. Coronal reformatted images, FIGS. 8B and 8E, show positions of the sagittal slices, FIGS. 8A, 8C, 8D, and 8F, where the SEPI-VAT coronal reformatted image, FIG. 8B, shows almost no distortion of screws compared to the spin echo of the coronal reformatted image, FIG. 8E. In sagittal images on the left, FIGS. 8A and 8D, the entire spine is clearly shown in the SEPI-VAT image, FIG. 8D, but severe signal loss results in the spin echo image (arrows), FIG. 8A. Images on the right, FIGS. 8C and 8F, show better detail of the hardware in SEPI-VAT. However, the SEPI-VAT images have reduced resolution and some blurring through-slice, which can be addressed.

Advantages and Improvements Over Other Methods

An MRI technique that completely avoids distortion when imaging near metal is a "single-point" or fully-phase-encoded technique is disclosed in Gravina S, Cory D G., "Sensitivity and resolution of constant-time imaging," J Magn Reson Series B 1994; 104:53-61, which is incorporated by reference for all purposes. Using a spin-echo sequence with single point imaging, a 20 ms TR and 256×192×48 matrix size, the scan time is 13 hours. For the same matrix size, and 3 kHz RF bandwidth, which is shown under "Variations and Modifications" it would be possible to achieve the same matrix size in 16 minutes using SEPI-VAT, assuming frequency shifts within ±8 kHz. With some additional speed-up factors, the scan time can be further reduced.

Both SEPI-VAT and EPSI-VAT use Fourier encoding to resolve the frequency-induced shifts. A consequence is that the encoding results in averaging, which increases the signal-to-noise ratio (SNR). This is an advantage compared with methods that may excite a limited frequency range in an interleaved manner to limit the distortion.

Another advantage of SEPI-VAT or EPSI-VAT is that they both allow slab selective imaging. It is possible to limit in-plane distortion by using a non-spatially-selective excitation. However, by using high band-width excitations and thin slabs, a selective volume may be imaged. This results in the standard scan time reduction compared with the case where non-selective imaging is used.

Variations and Modifications

There are several modifications of the principles of the SEPI-VAT and EPSI-VAT techniques. First, although VAT is effective, the in-plane distortion could be corrected in other ways. Second, an embodiment of the invention uses increased bandwidth RF pulses to improve sequence efficiency. Third, an embodiment of the invention may optimize the slab thickness practically. Finally, the use of parallel imaging can be added to reduce scan times.

Non-VAT Implementation: Although SEPI-VAT and EPSI-VAT both use view angle tilting to eliminate in-plane distortions, these could conceivably be corrected in post-processing. Since either the slab shift or the frequency shift is resolved, it would be possible to deduce the in-plane shift from this information and "un-warp" the image to correct in-plane distortions.

Figure 9:
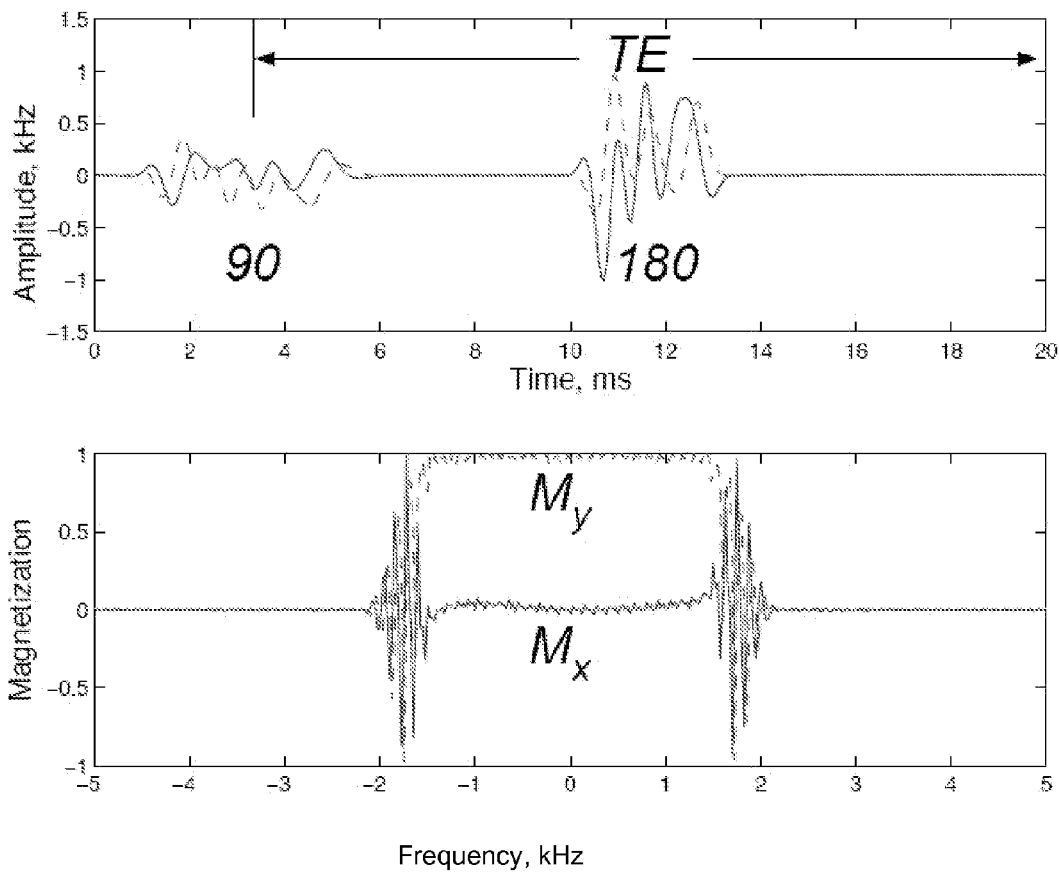
FIG. 9 shows graphs of an example of a matched phase 90 and 180 degree pulse pair at maximum peak amplitude.

Increased Bandwidth RF Pulses: The amount of through-slice distortion ($\Delta z$) is inversely proportional to the RF pulse bandwidth. The metal artifact reduction sequence (MARS) attempts to maximize the RF bandwidth. However, the maximum excitation pulse bandwidth is still limited by the peak RF amplitude of the 180 degree pulses. Although the use of reduced-flip angle refocusing pulses is possible as described in Alsop D C., "The sensitivity of low tip angle RARE imaging," Magn Reson Med 1997; 37:176-184, incorporated herein by reference for all purposes, an alternate (and complementary) solution is to use a phase-compensated 90-180 pair. Here, the phase of the 90 and 180 pulses is not constrained to be linear, but the combination produces a phase that is perfectly linear. Removing the linear constraint on individual pulses allows pulse pairs having as much as a factor of 3 reduction in peak amplitude, as shown in FIG. 9. This translates to a larger RF bandwidth which decreases the ratio of distortion to slice or slab width. The design of these pulses can easily be optimized for reduced-flip angles when SAR becomes a limitation. Although B1 inhomogeneity near metal may alter the actual profiles, this is unlikely to adversely affect imaging.

FIG. 9 shows graphs of an example of a matched phase 90 and 180 degree pulse pair at maximum peak amplitude (1 kHz nutation frequency is about 0.2 G) that achieve a 3 kHz bandwidth (b) compared with 1 kHz for standard pulses at the same peak amplitude, with a perfect spin echo ($M_x$, $M_y$ constant over the profile). This can either be used to reduce spatial distortion, or to increase slice/slab thickness without changing the range of slice distortions. For the SEPI-VAT technique, in an embodiment of the invention, this allows a speedup of a factor of 3. It should be noted that oscillations at the edge of the profile are removed by the use of standard crusher pulses.

Figure 10:
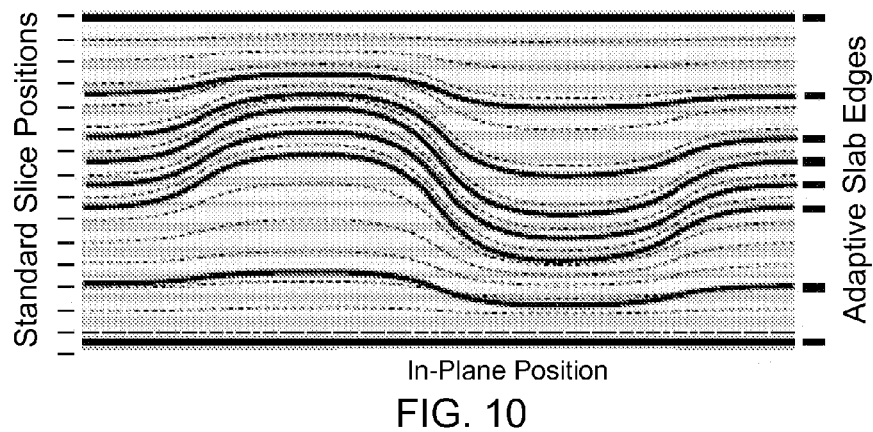
FIG. 10 shows a graph of a frequency distribution in thin slices from a SEPI-VAT.

Optimizing Slab Thickness: Although the images demonstrated use a 3-4 mm thick slice, there are advantages to SEPI-VAT with thin slabs (several to many slices thick) using a combination of matched-phase RF pulses and reduced-flip angle refocusing pulses. Reducing the number of slabs will proportionately reduce scan times, by a factor of 3-4. A further extension is to adapt the thickness of each slab so that the spatial distortion is kept roughly constant, allowing thicker slabs where the frequency range is smaller, as shown in FIG. 10, which can provide an additional factor of 2 scan-time reduction. In an embodiment of the invention a slab thickness is preferably between 3 mm to 40 mm thick, although these numbers are somewhat arbitrary and the method can conceptually work with almost any thickness.

FIG. 10 shows a graph of a frequency distribution in thin slices from a SEPI-VAT. In SEPI-VAT, a quick measurement of the frequency distribution in thin slices (dashed line boundaries) can be used to adaptively alter slab width (solid line boundaries) so that the total spatial distortion across each slab is the same. In this example, the slab width is set such that 11 phase-encoded sections resolve the distortion of each slab, and the required number of slabs decreases from 15 to 7—a factor of 2 reduction in scan time.

A quick spectral prescan can be performed for each of many thin slabs, where the slab excitation and 180 degree pulse are played once and data acquired with all gradients off. The readout is Fourier transformed to give the spectrum for the excited slab. If the spectrum for the slab is narrow, then there is less spatial slab distortion, and the slab width can be increased. Overall, the full volume can then be covered with fewer excitations. Because the slice excitation profile is actually resolved by the phase-encoding, it is not important that the different excited slabs are of different thickness. Furthermore, since the metallic implants are usually near the middle of the slice range, it is expected that this technique could either accelerate imaging by a factor of two (as in FIG. 10), or allow an increase in the slice range at low cost.

Fast Imaging: The averaging effect of SEPI-VAT or EPSI-VAT provides a high SNR that can be traded for reduced scan time using more efficient encoding approaches. These could include either parallel imaging with multiple coils, as described in Sodickson D K, Manning W J., "Simultaneous acquisition of spatial harmonics (SMASH): Fast imaging with radiofrequency coil arrays," Magn Reson Med 1997; 38:591-603 and Pruessmann K P, Weiger M, Scheidegger M B, Boesiger P., "SENSE: Sensitivity encoding for fast MRI," Magn Reson Med 1999; 42:952-962, both of which are incorporated by reference for all purposes, or partial Fourier acquisition/reconstruction, which is described in Noll D C, Nishimura D G, Macovski A., "Homodyne detection in magnetic resonance imaging," IEEE Trans Med Imaging 1991; 10:154-163, which is incorporated by reference for all purposes.

Basic Requirements

Almost all techniques presented here require only a basic MRI scanner. Parallel imaging can decrease acquisition times, and is becoming standard on most MR systems. Thus various embodiments of the invention may be widely applicable to clinical MRI.

Summary

An embodiment of the invention provides MR imaging near metallic implants while eliminating the distortions that are typically present. The basic idea is a multi-slice or multiple thin-slab technique with phase encoding in the slice or slab direction to resolve and eliminate through-slice distortion. This can be combined with view angle tilting to simultaneously remove in-plane distortions. The effectiveness of these techniques has been demonstrated in a shoulder implant phantom as well as in a volunteer with implanted spinal hardware. Other embodiments will provide a solution to assessment of patients after implanting metal, a pressing clinical need.

By resolving slice or slab-profile distortions, the distorted slabs or slices may be imaged and "re-binned" into a 3D image, where each spin is excited in exactly one slab or slice, and after resolving distortion to profiles, the signals from each spin can be placed in the correct place in the 3D image, regardless of which slab it was imaged in.

Generalized Process

Figure 11:
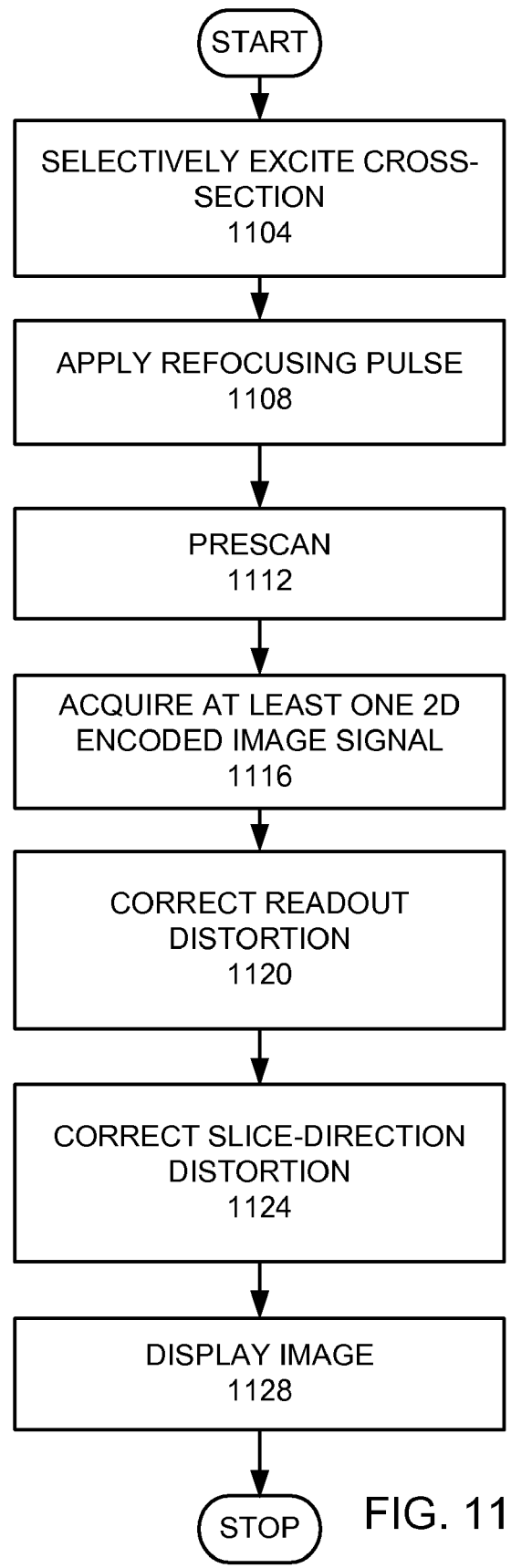
FIG. 11 is a high level flow chart of an embodiment of the invention.

To facilitate understanding, FIG. 11 is a high level flow chart of an embodiment of the invention. At least one cross-section is selectively excited using a RF pulse with a bandwidth (step 1104). The cross-section may be a slice or a slab, which as discussed above, has a thickness of more than one slice. The selective cross-section has a thickness along a first axis. A refocusing pulse is applied to form a spin echo (step 1108). Such a refocusing pulse may be reduced-flip angle refocusing pulses or a phase-compensated 90-180 pair. A spectral prescan is performed and used to predict distortion (step 1112). Such a spectral prescan would be followed by another compensated 90-180 pair. At least one 2D encode image signal is acquired (step 1116). Readout distortion is corrected (step 1120). This may be done by applying view angle tilting. This may also be done using post-processing, since resolving a slab shift or frequency shift makes it possible to deduce the in-plane shift from this information and "un-warp" the image to correct in-plane distortion. Slice-direction distortion is corrected (step 1124). This may be done by encoding and resolving spectral information and using cross-section thickness and RF bandwidth to undo slice direction distortion. A Fourier encoding may be used to do this. A resulting image is displayed (step 1128). The image is corrected for slice-direction distortion to allow an undistorted MRI near a metal object.

Figure 12:
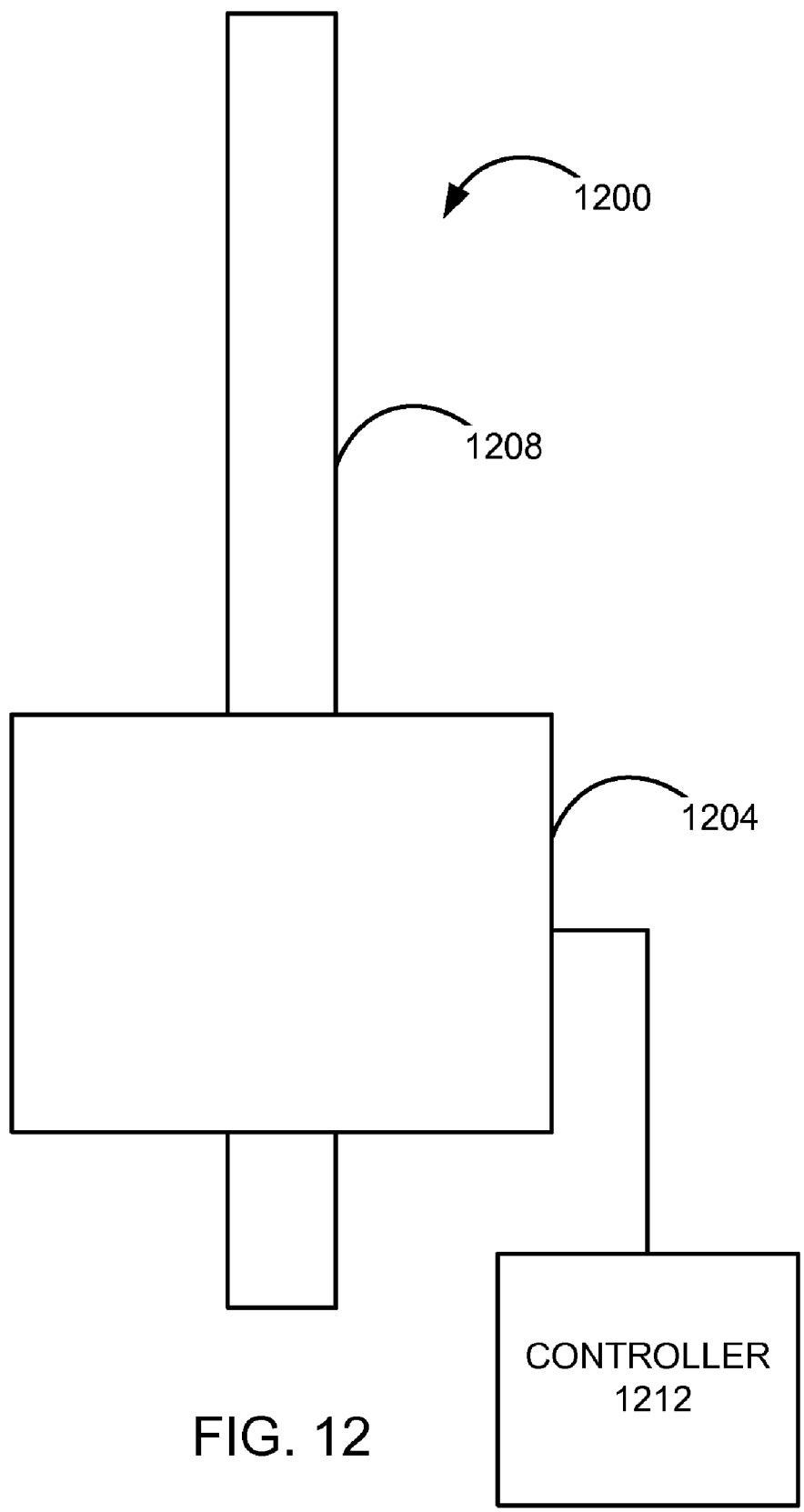
FIG. 12 is a schematic top view of a magnetic resonance imaging (MRI) system that may be used in an embodiment of the invention.

FIG. 12 is a schematic top view of a magnetic resonance imaging (MRI) system 1200 that may be used in an embodiment of the invention. The MRI system 1200 comprises a magnet system 1204, a patient transport table 1208 connected to the magnet system, and a controller 1212 controllably connected to the magnet system. In one example, a patient would lie on the patient transport table 1208 and the magnet system 1204 would pass around the patient. The controller 1212 would control magnetic fields and radio frequency (RF) signals provided by the magnet system 1204 and would receive signals from detectors in the magnet system 1204. In one embodiment, the magnet system 1204 would use a single excitation coil to excite the first volume and the second volume. In another embodiment, the magnet system 1204 would use multiple excitation coils to excite the first volume and the second volume.

Figure 13A:
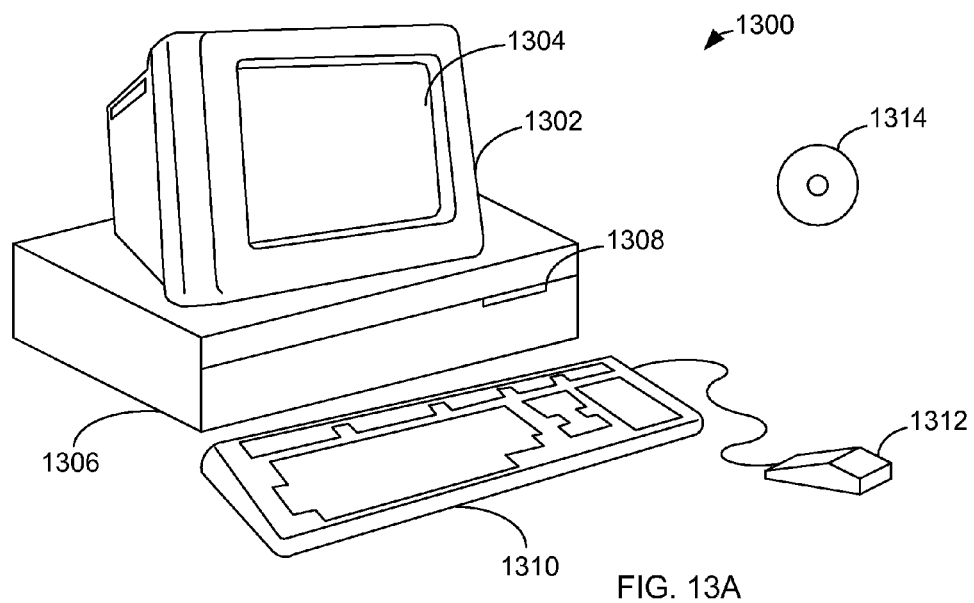
FIGS. 13A and 13B illustrate a computer system that may be used in an embodiment of the invention.
Figure 13B:
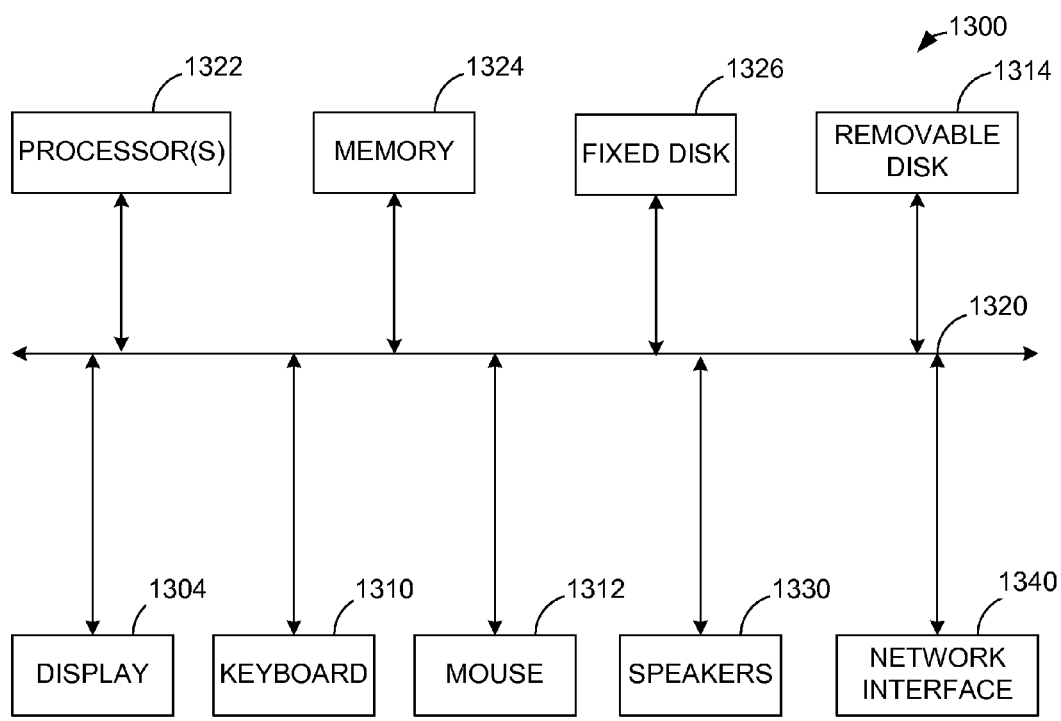

FIGS. 13A and 13B illustrate a computer system 1300, which is suitable for implementing a controller 1212 used in embodiments of the present invention. FIG. 13A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 13B is an example of a block diagram for computer system 1300. Attached to system bus 1320 are a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this example, the controller 1212 may be used to generate and then display an image on the display 1304.

In an embodiment the range of frequencies in a slice or slab (cross-section) may be measured in a pre-scan by providing 90 degree and 180 degree pulses and then obtaining a free induction decay and then measuring the range of frequencies for the excited slice.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for 3D magnetic resonance imaging (MRI) with slice-direction distortion correction for distortion caused by field inhomogeneities, comprising:
   a) exciting one or more selective cross-sections with a thickness along a first axis using a RF pulse with a bandwidth, wherein a selective cross-section is either a selective slice or selective slab;
   b) applying a refocusing pulse to the excited one or more selective cross-sections to form a spin echo;
   c) acquiring one or more 2D encoded image signals from the spin echo with readout along a second axis and phase encoding along a third axis; and d) correcting slice-direction distortion of the one or more 2D encoded image signals by resolving the position by resolving the frequency offset.

2. The method, as recited in claim 1, further comprising correcting readout distortion.

3. The method, as recited in claim 2, wherein the correcting readout distortion comprises using spectral information combined with readout bandwidth and pixel size to correct in-plane distortion.

4. The method, as recited in claim 2, wherein correcting readout distortion comprises applying view angle tilting.

5. The method, as recited in claim 4, wherein step d comprises encoding and resolving spectral information, and using a cross-section thickness and RF bandwidth to undo slice-direction distortion.

6. The method, as recited in claim 5, wherein the encoding is a Fourier encoding.

7. The method, as recited in claim 6, wherein excited cross-section thickness varies to maintain a relatively constant frequency variation within the excited cross-section.

8. The method, as recited in claim 7, further comprising measuring the frequency spectrum to predict distortion using a spectral prescan.

9. The method, as recited in claim 8, wherein the excitation-refocusing pulses are a matched-phase pulse pair with individual pulses not necessarily having linear phase.

10. The method, as recited in claim 9, wherein the encoding comprises using cross-section excitation profile imaging with view angle tilting.

11. The method, as recited in claim 10, wherein the encoding of frequency offset information comprises using echo-planar spectroscopic imaging.

12. The method, as recited in claim 1, wherein step d comprises applying additional phase encoding along the first axis to correct slice-direction distortion by resolving an actual location.

13. The method, as recited in claim 1, wherein step d comprises encoding and resolving spectral information, and using the slice thickness and RF bandwidth to undo slice-direction distortion.

14. The method, as recited in claim 13, wherein the encoding is a Fourier encoding.

15. The method, as recited in claim 13, wherein the encoding comprises using slab excitation profile imaging.

16. The method, as recited in claim 13, wherein the encoding comprises using echo-planar spectroscopic imaging.

17. The method, as recited in claim 1, wherein excited cross-section thickness varies to maintain a relatively constant frequency variation within the excited slab.

18. The method, as recited in claim 1, wherein the correcting slice-direction by resolving position, resolves position directly.

19. The method, as recited in claim 1, wherein the correcting slice-direction by resolving position, resolves position indirectly.

20. An apparatus for providing 3D magnetic resonance imaging with slice-direction distortion compensation for distortion caused by field inhomogeneities, comprising:
 a magnetic resonance imaging excitation and detection system; and
 a controller electrically connected to the magnetic resonance imaging excitation and detection system, comprising:
  a display;
  at least one processor; and
  non-transitory computer readable media, comprising:
   computer readable code for causing the apparatus to excite one or more selective cross-sections with a thickness along a first axis using a RF pulse with a bandwidth, wherein a selective cross-section is either a selective slice or selective slab;
   computer readable code for causing the apparatus to apply a refocusing pulse to the excited one or more selective cross-sections to form a spin echo;
   computer readable code for causing the apparatus to acquire one or more 2D encoded image signals from the spin echo with readout along a second axis and phase encoding along a third axis;
   computer readable code for causing the apparatus to correct slice-direction distortion of the one or more 2D encoded image signals by resolving the position by resolving the frequency offset; and
   computer readable code for causing the apparatus to display a 3D magnetic resonance image with slice-direction distortion correction on the display.

* * * * *